(12) United States Patent
Tanaka et al.

(10) Patent No.: US 7,158,547 B2
(45) Date of Patent: Jan. 2, 2007

(54) WAVELENGTH TUNABLE LASER OF SMALL SIZE

(75) Inventors: Shinsuke Tanaka, Kawasaki (JP); Ken Morito, Kawasaki (JP); Kazumasa Takabayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 254 days.

(21) Appl. No.: 11/004,907

(22) Filed: Dec. 7, 2004

(65) Prior Publication Data

US 2005/0226284 A1     Oct. 13, 2005

(30) Foreign Application Priority Data

Apr. 13, 2004   (JP)   ............................. 2004-118194

(51) Int. Cl.
    *H01S 3/10*    (2006.01)
    *H01S 5/00*    (2006.01)
(52) U.S. Cl. ........................................ 372/20; 372/50.1
(58) Field of Classification Search ................. 372/20, 372/50.1
    See application file for complete search history.

(56) References Cited

U.S. PATENT DOCUMENTS

| | | | |
|---|---|---|---|
| 4,803,692 A | 2/1989 | Sakano et al. | |
| 5,157,675 A | 10/1992 | Takagi | |
| 6,205,159 B1 | 3/2001 | Sesko et al. | |
| 6,724,799 B1 * | 4/2004 | Ryu et al. | 372/102 |

FOREIGN PATENT DOCUMENTS

| | | |
|---|---|---|
| EP | 0 556 952 | 8/1993 |
| EP | 1 349 245 | 10/2003 |
| JP | 6-29628 | 2/1994 |
| JP | 8-186313 | 7/1996 |
| JP | 2003-283024 | 10/2003 |
| WO | 00/22705 | 4/2000 |
| WO | 03/077386 | 9/2003 |

OTHER PUBLICATIONS

K. Takabayashi, et al.; "Widely (90nm) Wavelength Tunable Laser Using a Semiconductor Optical Amplifier and an Acousto-Optic Tunable Filter;" *Proc. of ECOC 2003*; vol. 4; pp. 890-891./Discussed in the specification.

P.-J. Rigole, et al.; "114-nm Wavelength Tuning Range of a Vertical Grating Assisted Codirectional Coupler Laser with a Super Structure Grating Distributed Bragg Reflector;" *IEEE Photonics Technology Letters*; vol. 7; No. 7; Jul. 1995; pp. 697-699./Discussed in the specification.

European Patent Office Communication for corresponding European Search Report on the European patent application No. 04257320 dated Aug. 1, 2005.

* cited by examiner

*Primary Examiner*—Armando Rodriguez
(74) *Attorney, Agent, or Firm*—Armstrong, Kratz, Quintos, Hanson & Brooks, LLP

(57) ABSTRACT

A wavelength tunable laser device includes: a pair of reflection mirrors; a semiconductor element disposed between the pair of reflection mirrors, the semiconductor element integrating a region for providing an optical gain, a region having a wavelength tunable filter function and a phase control region; and an optical filter disposed between the semiconductor element and one of the pair of reflection mirrors, the optical filter having periodical transmission wavelengths. A wavelength tunable laser device is provided which is easy to be controlled and can be made compact.

15 Claims, 4 Drawing Sheets

WAVELENGTH TUNABLE LASER OF SMALL SIZE

CROSS REFERENCE TO RELATED APPLICATION

This application is based on and claims priority of Japanese Patent Application No. 2004-118194 filed on Apr. 13, 2004, the entire contents of which are incorporated herein by reference.

BACKGROUND OF THE INVENTION

A) Field of the Invention

The present invention relates to a laser device and more particularly to a wavelength tunable laser device.

B) Description of the Related Art

In order to cope with increasing data traffic, a wavelength division multiplexing (WDM) optical communication system has been developed and is in practical use, which transmits optical signals of a plurality of wavelengths via a single optical fiber at a time. In a conventional WDM optical communication system, sophisticated processes such as optical add drop multiplexer (OADM), wavelength routing and optical packet transmission have been studied in order to realize a large capacity flexible system by positively utilizing the wavelength information of an optical signal. In order to realize such processes, a wavelength tunable laser of a single device having a wide wavelength tunable range and a high output power has been desired as a light source.

Japanese Patent Laid-open Publication No. 2003-283024 proposes a novel structure of a wavelength tunable laser of a single device and a high output having a wide wavelength tunable range.

FIG. 5A shows the structure proposed in Japanese Patent Laid-open Publication No. 2003-283024. A gain medium 54 having an optical gain in a wide wavelength range, a band-pass filter 55 and an etalon filter 56 are disposed along an optical axis 57 between a reflection mirror 51 and a semi-transparent mirror 52. The reflection mirror 51 and semi-transparent mirror 52 define a cavity 50. The gain medium 54 is structured, for example, by a semiconductor optical amplifier (SOA). The band-pass filter 55 is structured, for example, by an acousto-optical tunable filter (AOTF). A frequency controller 58 controls the pass band of the band-pass filter 55. The etalon filter 56 is structured by a Fabry-Perot etalon filter. The etalon filter is designed and disposed so that it has a periodical sharp transmission (wavelength) spectrum, for example, satisfying the specifications of an International Telecommunications Union (ITU) grid.

Optical gain extending over a wide frequency range are generated by the gain medium 54, and only narrow band energies are filtered by the band-pass filter 55, and further filtered by the etalon filter having transmission wavelengths of the periodical sharp transmission characteristics. Resonance is formed by the cavity. An SOA-AOTF laser using such SOA and AOTF generates a high output laser beam in a single mode.

The specific structure and measured performances of such an SOA-AOTF laser was pronounced by K. Takabayashi et al. in Proc. of ECOC 2003, vol. 4, 890.

FIG. 5B shows the structure of an SOA-AOTF laser. The layout of this structure has the reversed right and left of the structure shown in FIG. 5A. A semiconductor optical amplifier SOA is used as the gain medium 54, whose one facet constitutes the semi-transparent mirror 52. The band-pass filter 55 and Fabry-Perot etalon 56 are disposed between SOA and the reflection mirror 51.

The band-pass filter 55 is constituted of two AOTF having a symmetrical structure to eliminate a Doppler shift. A lens 59 is disposed between the band-pass filter 55 and Fabry-Perot etalon 56 to improve an optical coupling efficiency. The cavity 50 defined between the semi-transparent mirror 52 and reflection mirror 51 has a length of 50 mm. About 90 nm of a wavelength tunable width $\Delta\lambda$ is obtained.

A combination of these three devices can be considered promising: a device having an optical gain over a wide wavelength range; a wavelength filter having a sharp (periodical, fixed or finely adjusted) wavelength selectivity; and a wavelength filter having a wide wavelength tunable range with a coarse wavelength selectivity.

Japanese Patent Laid-open Publication No. HEI-6-29628 proposes an optical coupler and a semiconductor laser made of a gain section and a wavelength selection coupler integrated together. Lower and upper waveguides are formed in a semiconductor structure, and a diffraction grating is formed above the lower and upper waveguides to provide selective coupling between the lower and upper waveguides. The expected filter band width is described as 2.5 nm.

IEEE Photonics Technology Letters, vol. 7, no. 7, (1995) 697–699 propose a grating assisted codirectional coupler laser with super structure grating reflector (GCSR) laser having the above-described three functions integrated together. A gain section, a coupler section, a phase control section and a reflection section are formed on an InP substrate and electrodes are formed independently for each section. The coupler section has upper and lower waveguides and a diffraction grating formed above the upper and lower waveguides, similar to the wavelength selection coupler of Japanese Patent Laid-open Publication No. HEI-6-29628, and realizes the wavelength tunable filter function by utilizing the phenomenon that light in a specific wavelength range determined by an equivalent refractive index difference between two waveguides controllable by current injection is selectively moved between two waveguides. The reflection section is structured by a superstructure grating reflector and has the periodical sharp wavelength filer characteristics. The transmission peak wavelength of this filter can also be finely adjusted by current injection. A single longitudinal mode oscillation can be realized and a wide wavelength tunable range $\Delta\lambda$ of 100 nm can be obtained.

SUMMARY OF THE INVENTION

An object of this invention is to provide a wavelength tunable laser device easy to be controlled and excellent in a wavelength selectivity.

Another object of this invention is to provide a wavelength tunable laser device easy to be controlled and capable of a high optical output.

According to one aspect of the present invention, there is provided a wavelength tunable laser device comprising: a pair of reflection mirrors; a semiconductor device disposed between the pair of reflection mirrors, the semiconductor device integrating a region for providing an optical gain, a region having a wavelength tunable filter function and a phase control region; and an optical filter disposed between the semiconductor device and one of the pair of reflection mirrors, the optical filter having periodical transmission wavelengths.

The semiconductor device having the gain region, wavelength tunable region and phase control region can be controlled easily by three electrodes. A combination of the optical filter having the periodical sharp transmission wavelength characteristics and the semiconductor device can realize oscillation at a single wavelength.

A wavelength tunable laser device can be provided which has a high output, a broad tunable wavelength range and an easy control.

DESCRIPTION OF THE PREFERRED EMBODIMENTS

Figure 1:
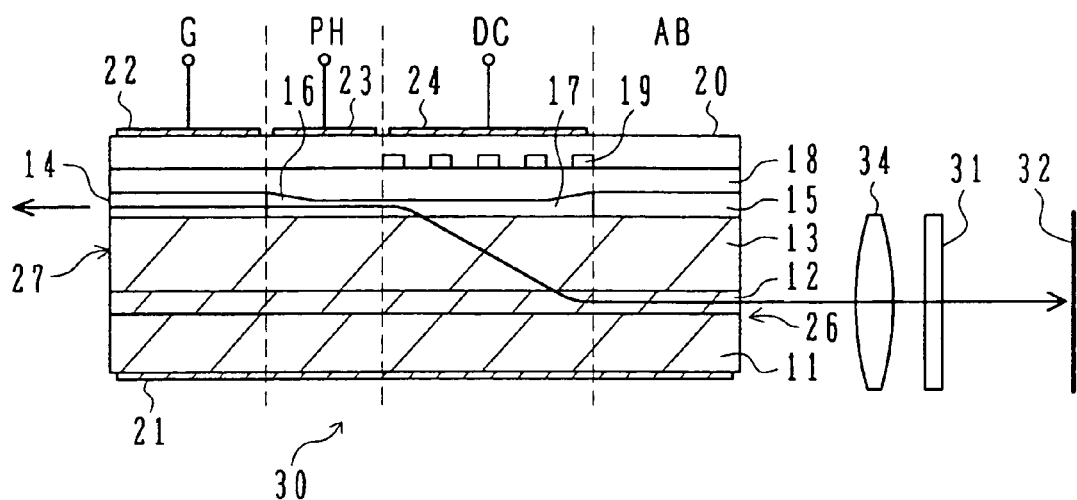
FIG. 1 is a longitudinal cross sectional view showing briefly the structure of a wavelength tunable laser device according to an embodiment of the invention.

FIG. 1 is a cross sectional view schematically showing the structure of a wavelength tunable semiconductor laser device according to an embodiment of the present invention. A semiconductor device 30, a Fabry-Perot etalon 31 and a reflection mirror 32 are disposed along an optical axis. If necessary, a lens 34 is mounted. The left side end face of the semiconductor device 30 is a cleavage plane or a low reflection (partial reflection) plane 27 low-reflection coated with a dielectric multi-layer film. The right end face of the semiconductor device is a non-reflection plane 26 non-reflection coated with a dielectric multi-layer film. The low reflection plane 27 and mirror 32 define a cavity. The semiconductor device 30 has a gain region G, a phase control region PH, a directional coupler region DC and an absorption region AB. Although the etalon filter is made of a solid state etalon filter, it may be made of an air gap etalon filter.

The semiconductor device 30 has an InGaAsP lower waveguide layer 12, an n-type InP spacer layer 13 and an upper waveguide layer formed on an n-type InP substrate in this order from the bottom. The lower waveguide layer 12 has a bandgap wavelength longer than the bandgap of InP and shorter than an object oscillation wavelength (having a higher refractive index than that of InP). The upper waveguide layer has a bandgap wavelength longer than that of InP (having a higher refractive index than InP).

The upper waveguide layer is constituted of: a multiple quantum well active layer 14 capable of generating light having a wavelength in the objective 1.5 micron band, formed on the left side; a multiple quantum well absorbing layer 15 capable of absorbing light generated by the multiple quantum well active layer 14, formed on the right side; and waveguide layers 16 and 17 capable of transmitting light generated by the multiple quantum well active layer 14, formed between the multiple quantum well active layer 14 and multiple quantum well absorbing layer 15. The upper and lower waveguide layers 17 and 12 have different reflectivities (refractive index difference Δn). The multiple quantum well absorbing layer 15 can be made of the same lamination structure as that of the multiple quantum well active layer 14. The multiple quantum well structure has preferably an optical confinement structure (semiconductor confinement hetrojunction: SCH) by adding a low reflective layer above and under a multiple quantum well.

A p-type InP upper spacer layer 18 is formed on the upper waveguide layer, and a diffraction grating 19 having a period of 15 μm is formed on a partial upper surface of the upper spacer layer 18. A p-type InP buffer layer 20 covers the diffraction grating. On the p-type buffer layer 20, electrodes 22, 23 and 24 are formed at positions corresponding to the upper waveguide layers 14, 16 and 17. An electrode 21 is formed on the bottom of the substrate 11.

A light amplifying function of the semiconductor device can be realized by the composite structure of the electrode 22, buffer layer 20, spacer layer 18, multiple quantum well active layer 14, spacer layer 13, lower waveguide layer 12, substrate 11 and electrode 21, respectively in the gain region G. Light can be generated in the multiple quantum well by flowing a forward current from the electrode 22 toward the electrode 21.

A phase control function can be realized by the composite structure of the electrode 23, buffer layer 20, spacer layer 18, upper waveguide layer 16, spacer layer 13, lower waveguide layer 12, substrate 11 and electrode 21, respectively in the phase control region PH. The upper waveguide layer 16 in the phase control region has a composition transparent to light generated from the multiple quantum well, and the refractive index can be controlled by flowing a forward current from the electrode 23 toward the electrode 21.

A diffraction grating loading directional coupler can be realized by the composite structure of the electrode 24, buffer layer 20, diffraction grating 19, spacer layer 18, upper waveguide layer 17, spacer layer 13, lower waveguide layer 12, substrate 11 and electrode 21, respectively in the directional coupler region DC. Light having a specific wavelength moves between the upper and lower waveguide layers, depending upon the period of the diffraction grating and the equivalent refractive index difference Δn between those of the upper and lower waveguide layers.

The composite structure of the buffer layer 20, spacer layer 18, multiple quantum well absorbing layer 15, spacer layer 13, lower waveguide layer 12 and substrate 11, respectively in the absorbing region AB, has no upper electrode. The multiple quantum well absorbing layer 15 of the upper waveguide layer absorbs light generated from the multiple quantum well active layer 14 and transmitted through the upper waveguide layers 16 and 17. The lower waveguide layer 12 transmits light moved from the upper waveguide layer 17.

Light generated in the multiple quantum well active layer 14 in the gain region G moves to the lower waveguide layer 12 via the phase control region PH and diffraction grating loading directional coupler DC, and is subjected to gentle wavelength selection. Light transmitted through the lower waveguide layer and output from the non-reflection plane 26 at the right side end face of the semiconductor device 30 is given a sharp wavelength selectivity by transmitting through the Fabry-Perot etalon 31. Light reflected at the mirror 32 and returned to the Fabry-Perot etalon 31 and to the semiconductor device 30 moves in the semiconductor device 30 along a path reversing the path described above, and is returned at the low reflection plane 27 at the left side end face to repetitively reciprocate in the cavity. With these operations, oscillation occurs in the single longitudinal mode.

Figure 2:
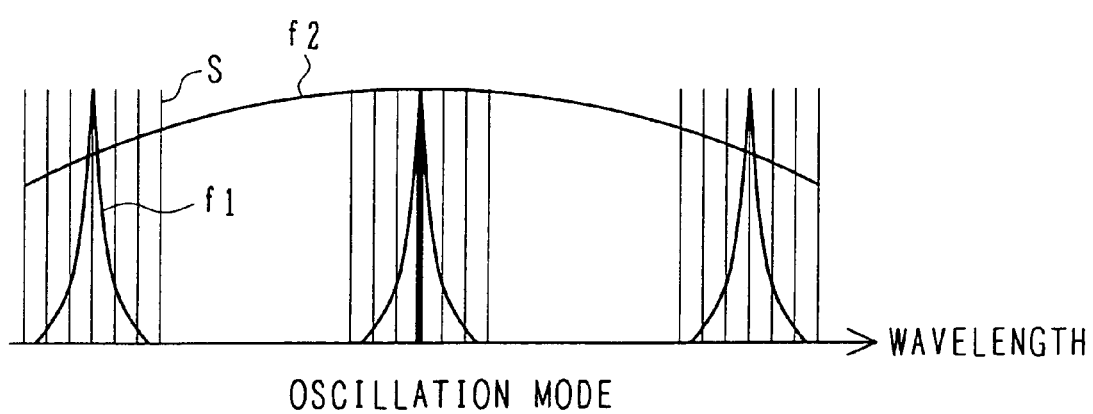
FIG. 2 is a graph showing an oscillation mode of the wavelength tunable laser device shown in FIG. 1.

FIG. 2 is a graph showing the wavelength selectivity of the oscillation mode. The abscissa represents a wavelength and the ordinate represents a light intensity or transmissivity in a simplified shape. The longitudinal mode s has a wavelength interval defined by a cavity length. In order to broaden the interval of longitudinal modes s, it is preferable to shorten the cavity length.

The structure shown in FIG. 1 using the semiconductor device 30 integrating the gain device and the wavelength filter with a wide wavelength tunable range, can shorten the cavity length more than the structure (SOA-AOTF) using a semiconductor optical amplifier (SOA) and an acousto-optical tunable filter (AOTF) having a wide wavelength tunable range. The structure shown in FIG. 1 can be implemented easily, and the coupling loss in the resonator is small so that a high output is possible.

Wavelength selectivities f1 of the Fabry-Perot etalon 31 are sharp and distributed periodically on the wavelength axis. The transmission wavelength of the Fabry-Perot etalon is preferably made in conformity with the grid stipulated by ITU (e.g., wavelengths at an interval of 100 GHz or 50 GHz at the center wavelength of 194.1 THz). With this arrangement, the laser oscillation wavelength is always on the predetermined wavelength grid, without electric control.

A wavelength selectivity f2 of the diffraction loading directional coupler is coarse in a relatively broad wavelength range. A combination of the etalon and diffraction grating directional coupler in a short cavity length can provide oscillation at the single longitudinal mode wavelength.

In the structure shown in FIG. 1, the normal to the Fabry-Perot etalon is not made coincident with the optical axis, but is inclined several degrees. This inclination can prevent light reflected at the Fabry-Perot etalon from returning to the optical waveguide path of the semiconductor device. A wavelength tunable laser device having a cavity length of about 1 cm can be formed by setting the length of the semiconductor device to about 2 mm and the length, on the optical axis, of the structure of the lens, etalon and mirror, to about 8 mm.

Description will be made on a manufacture method for the semiconductor device shown in FIG. 1 including a 1.55 µm band semiconductor laser.

Figure 3A:
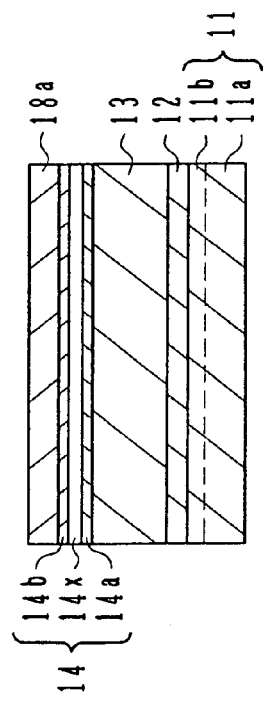
FIGS. 3A to 3E are cross sectional views illustrating an example of main manufacture processes for the wavelength tunable laser device.

As shown in FIG. 3A, on an n-type InP base substrate 11$a$, an n-type InP buffer layer 11$b$ is grown to a thickness of 500 nm to form an n-type InP substrate 11. Crystal growth can be performed, for example, by metal organic chemical vapor deposition (MOCVD) method. As shown in FIG. 1, the gain region G, phase control region PH, directional coupler (grating coupler) region DC and absorbing region AB are reserved on the substrate from the left to right in this order. On the n-type InP substrate 11, an n-type InGaAsP lower waveguide layer 12 is grown and an n-type InP lower spacer layer 13 having a thickness of 900 nm is grown on the lower waveguide layer. The lower waveguide layer has a bandgap of 1.1 µm and a thickness of 100 nm.

On the n-type InP lower spacer layer 13, an non-doped InGaAsP lower optical confinement layer 14$a$ is grown to a thickness of 180 nm. On the lower optical confinement layer 14$a$, a multiple quantum well layer 14$x$ having a thickness of 103 nm is formed. The multiple quantum well layer realizes an oscillation frequency of 1.55 µm and is a lamination of six layers of quantum well layers and corresponding barrier layers alternately stacked. On the multiple quantum well layer 14$x$, another non-doped optical confinement layer 14$b$ having a thickness of 180 nm is formed, to thereby obtain a multiple quantum well active layer 14 having a total thickness of 460 nm. The optical confinement layers 14$a$ and 14$b$ have a refractive index lower than that of the multiple quantum well layer 14$x$ and provide a function of confining light in the multiple quantum well layer in the longitudinal direction. On the multiple quantum well structure, a p-type InP first upper spacer layer 18$a$ is grown to a thickness of 60 nm.

Figure 3B:
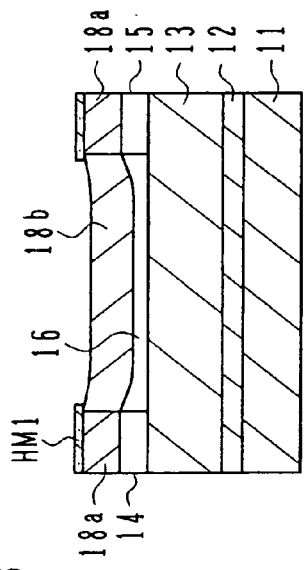

As shown in FIG. 3B, on the first upper spacer layer 18$a$ in the gain region and absorbing region, a hard mask layer HM1 of SiO$_2$ or the like is formed and the first upper spacer layer 18$a$ and multiple quantum well structure 14 in the exposed phase control region and grating coupler region are etched. The multiple quantum well structure is left in the gain region and absorbing region.

In the etched and removed region, an InGaAsP upper waveguide layer 16 (17) having a band edge wavelength $\lambda=1.4$ µm and a thickness of 380 nm and a p-type InP second upper spacer layer 18$b$ having a thickness of 140 nm are grown through butt joint. The hard mask layer HM1 is thereafter removed. The InP first upper spacer layer 18$a$ and InP second upper spacer layer 18$b$ form an InP layer continuous in a lateral direction.

Figure 3C:
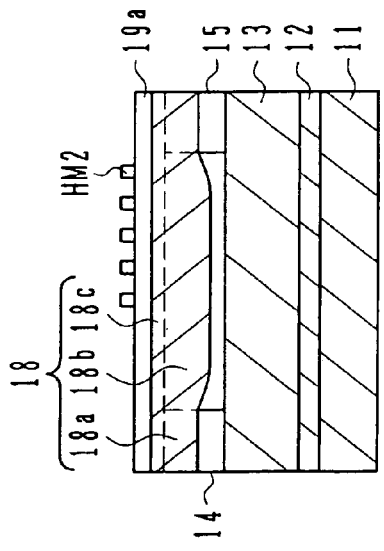

As shown in FIG. 3C, on the InP layers 18$a$ and 18$b$, a p-type InP third spacer layer 18$c$ having a thickness of about 50 nm is grown. The InP layers 18$a$, 18$b$ and 18$c$ form an InP upper spacer layer 18. On the InP upper spacer layer 18, an InGaAsP diffraction grating layer 19$a$ is grown which has a band edge wavelength $\lambda=1.38$ µm and a thickness of 70 nm. On the diffraction grating layer 19$a$, a hard mask HM2 of SiO$_2$ or the like is formed, which has a diffraction grating pattern at a period of 15 µm. By using the hard mask HM2, an unnecessary region of the diffraction grating layer 19$a$ is etched and removed. The hard mask HM2 is thereafter removed.

Figure 3D:
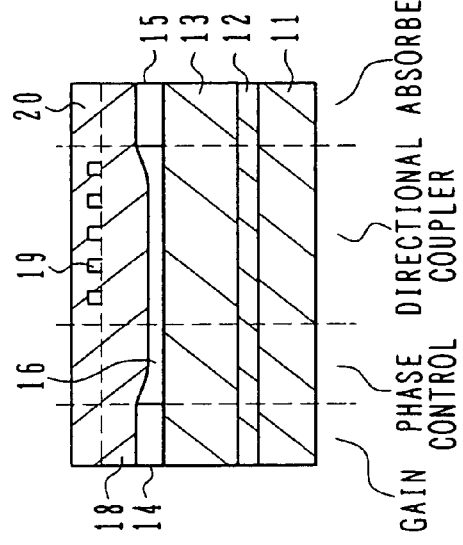

As shown in FIG. 3D, a p-type InP buffer layer 20 is grown to a thickness of about 300 nm as measured on the diffraction grating 19, burying the diffraction grating 19. The structure formed is a basic structure of the semiconductor device.

Figure 3E:
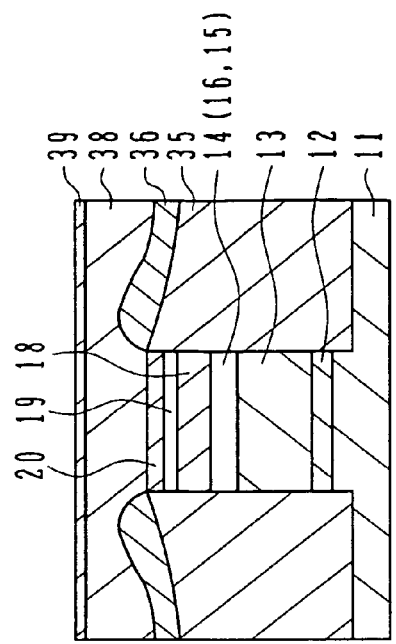

As shown in FIG. 3E, on the semiconductor lamination structure, a hard mask of a stripe pattern is formed which is made of SiO$_2$ and has a mesa width of about 1.5 µm. By using this hard mask, a mesa stripe structure is formed by dry etching. FIG. 3E is a cross sectional view taken along a direction perpendicular to the direction in FIG. 3D. After the mesa etching, a p-type InP burying layer 35 and an n-type InP burying layer 36 are grown to pn-burying the mesa stripe structure (a portion of a p-type InP layer 38 to be formed thereafter may be grown). After the hard mask is removed, a p-type InP layer 38 and an InGaAsP contact layer ($\lambda=1.1$ µm) 39 are formed. Electrodes (electrodes 21 to 24 shown in FIG. 1) are formed on the bottom of the substrate and on the upper surface of the contact layer, by well-known methods. Dielectric multi-layer films of low reflection coating and non-reflection coating are formed on opposite end faces to complete the semiconductor device shown in FIG. 1.

The substrate of the semiconductor device is not limited only to the InP substrate. Other group III–V compound semiconductor substrates such as a GaAs substrate may also be used for forming a laser device having a different wavelength band such as a 1.3 µm band.

Figure 4:
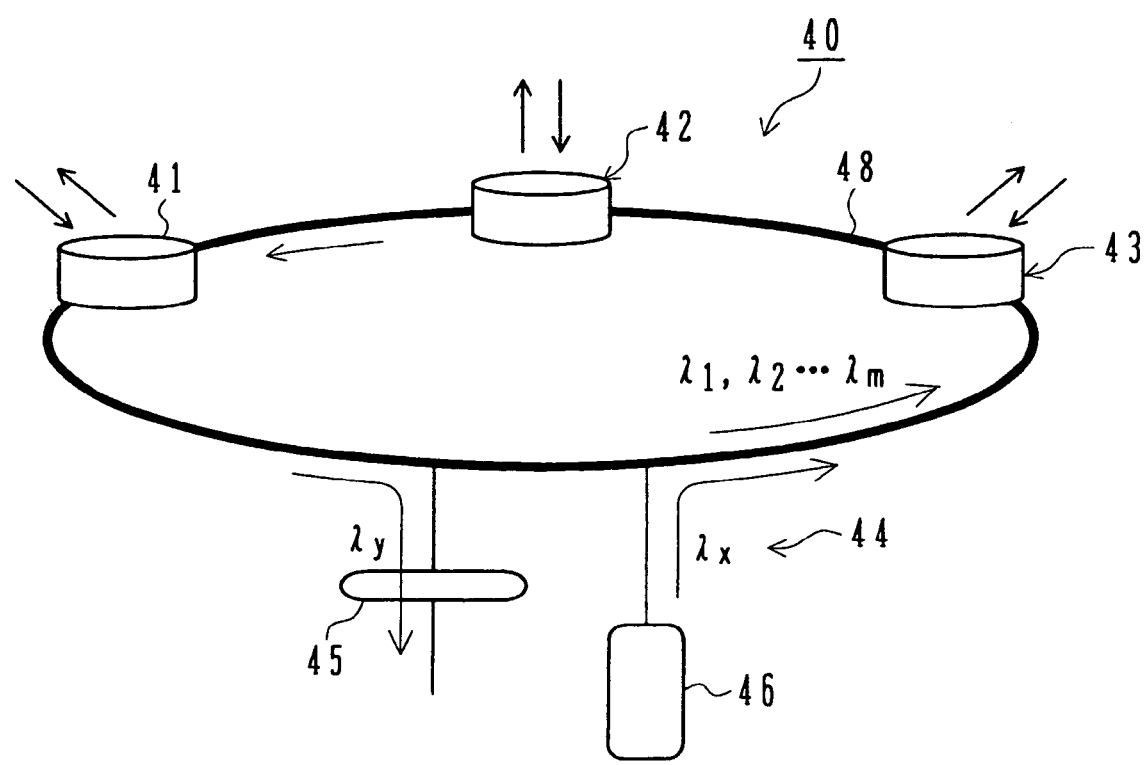
FIG. 4 is a perspective view briefly showing the structure of an optical communication system.
Figure 5A:
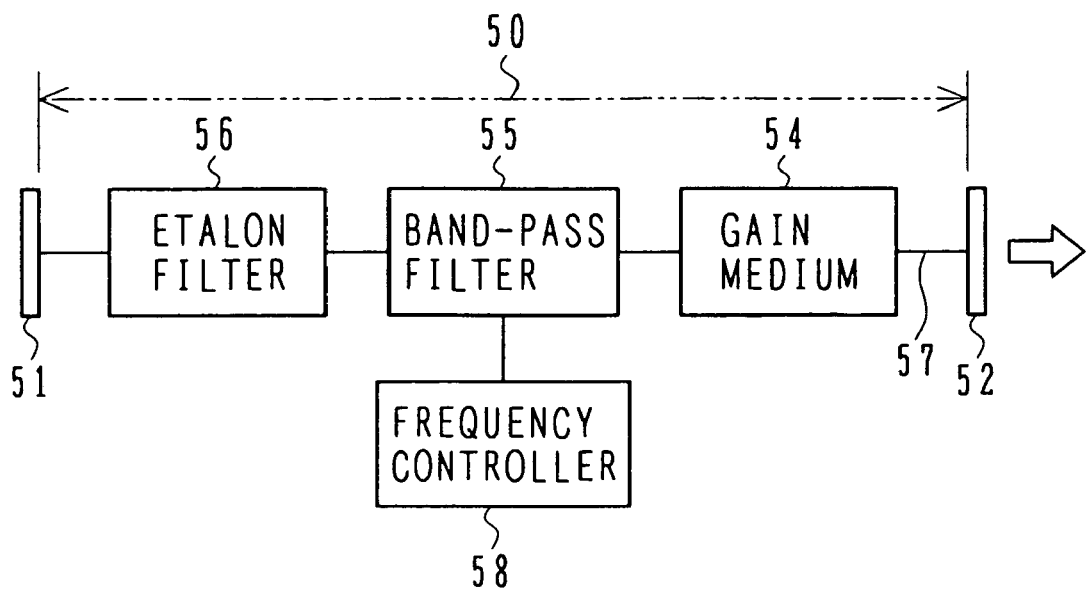
FIGS. 5A and 5B are a block diagram and a cross sectional view showing the structure of a wavelength tunable laser device having an SOA-AOTF structure according to prior art.
Figure 5B:
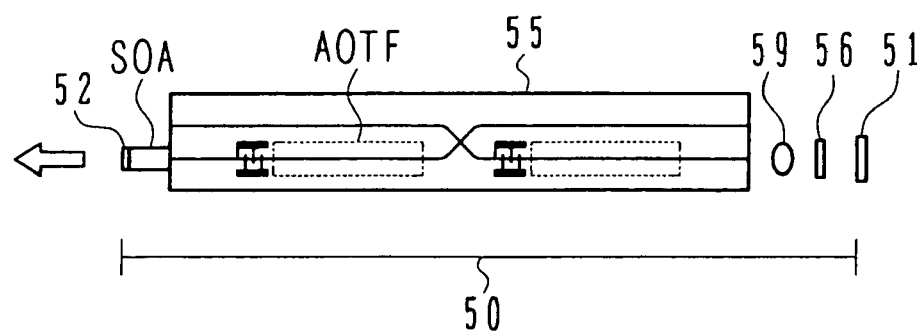

FIG. 4 is a schematic diagram showing an optical communication system using the wavelength tunable laser device described above. In an optical network 40, a plurality of optical add drop multiplexers (OADMs) 41, 42, 43 and 44 are interconnected by an optical fiber 48. The optical fiber 48 transmits optical signals having wavelengths $\lambda 1, \lambda 2, \ldots, \lambda n$. The optical add drop multiplexer 44 has a roll of picking up light having a wavelength $\lambda_y$ via a wavelength selection filter 45 and transmitting light having a wavelength $\lambda_x$ generated by a waveform tunable laser 46 to the optical fiber 48. The wavelength tunable laser device 46 is realized by the structure shown in FIG. 1.

The present invention has been described in connection with the preferred embodiments. The invention is not limited only to the above embodiments. It will be apparent to those skilled in the art that other various modifications, improvements, combinations, and the like can be made.

We claim:

1. A wavelength tunable laser device comprising:
   a pair of reflection mirrors;
   a semiconductor element disposed between said pair of reflection mirrors, said semiconductor element integrating a region for providing an optical gain, a region having a wavelength tunable filter function, and a phase control region; and
   an optical filter disposed between said semiconductor element and one of said pair of reflection mirrors, said optical filter having periodical transmission wavelengths.

2. The wavelength tunable laser device according to claim 1, wherein said semiconductor element has a common lower waveguide layer of a first conductivity type and a common spacer layer on a compound semiconductor underlying substrate of the first conductivity type.

3. The wavelength tunable laser device according to claim 1, wherein one of said pair of reflection mirrors is constituted of a cleaved plane of said semiconductor element at one end face or a multi-layer film formed on the cleaved plane.

4. The wavelength tunable laser device according to claim 3, wherein the other end face of said semiconductor element includes a non-reflection coating made of a dielectric multi-layer film.

5. The wavelength tunable laser device according to claim 1, wherein said region for providing an optical gain includes a multiple quantum well structure.

6. The wavelength tunable laser device according to claim 1, wherein said region having a wavelength tunable filter function includes a directional coupler having a diffraction grating.

7. The wavelength tunable laser device according to claim 6, wherein said phase control region is disposed between said region for providing an optical gain and said directional coupler.

8. The wavelength tunable laser device according to claim 1, wherein said optical filter having periodical transmission wavelengths includes an etalon filter.

9. The wavelength tunable laser device according to claim 8, wherein said etalon filter is disposed in such a manner that an optical incidence angle is inclined from a normal to an etalon filter surface.

10. The wavelength tunable laser device according to claim 1, wherein said optical filter having periodical transmission wavelengths has transmission peak wavelengths in conformity with wavelengths of ITU grid.

11. The wavelength tunable laser device according to claim 1, wherein said semiconductor element has a common lower waveguide layer of a first conductivity type, a common spacer layer and an upper waveguide layer on a compound semiconductor underlying substrate of the first conductivity type.

12. The wavelength tunable laser device according to claim 11, wherein said upper waveguide layer includes a multiple quantum well structure in said region for providing an optical gain.

13. The wavelength tunable laser device according to claim 11, wherein said region having a wavelength tunable filter function includes a diffraction grating and constituting a directional coupler having a diffraction grating.

14. The wavelength tunable laser device according to claim 13, wherein said phase control region is disposed between said region for providing an optical gain and said directional coupler.

15. The wavelength tunable laser device according to claim 11, wherein said upper waveguide layer includes an optical absorbing region on a side opposite to said region for providing an optical gain, with respect to said region having a wavelength tunable filter function.

* * * * *